(12) United States Patent
Vashchenko et al.

(10) Patent No.: US 6,559,507 B1
(45) Date of Patent: May 6, 2003

(54) COMPACT BALLASTING REGION DESIGN FOR SNAPBACK N-MOS ESD PROTECTION STRUCTURE USING MULTIPLE LOCAL N+ REGION BLOCKING

(75) Inventors: Vladislav Vashchenko, Fremont, CA (US); Andy Strachan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/896,284

(22) Filed: Jun. 29, 2001

(51) Int. Cl.$^7$ ................................................ H01L 23/62
(52) U.S. Cl. ..................... 257/356; 257/355; 257/357; 257/360

(58) Field of Search ............................... 257/335–336, 257/355, 360, 363

(56) References Cited

U.S. PATENT DOCUMENTS 5,498,892 A * 3/1996 Walker et al. ............... 257/336
6,110,771 A * 8/2000 Ahn ........................... 438/200

* cited by examiner

*Primary Examiner*—Nathan J. Flynn
*Assistant Examiner*—Johannes P Mondt
(74) *Attorney, Agent, or Firm*—Vollrath & Associates

(57) ABSTRACT

In a n+ snapback device, saturation current is limited by using one or more NLDD current blocking regions. This limits the snapback saturation current, while avoiding current stratification by providing for current spreading, and thus avoiding localized heating problems

17 Claims, 4 Drawing Sheets

COMPACT BALLASTING REGION DESIGN FOR SNAPBACK N-MOS ESD PROTECTION STRUCTURE USING MULTIPLE LOCAL N+ REGION BLOCKING

FIELD OF THE INVENTION

The invention relates to a NMOS structure and a method of limiting saturation current.

BACKGROUND OF THE INVENTION

A common way of protecting circuits against electrostatic discharge (ESD) is to use ESD protection clamps. In 80% to 90% of CMOS applications, grounded gate snapback N-MOS structures are the protection solution used. These work adequately during pulsed ESD operation but experience difficulties at continuous excessive currents or very high currents. The limited energy dissipation capabilities of grounded gate N-MOS ESD protection clamps can be attributed to the extremely localized region for heat dissipation, which corresponds to approximately a 0.5 $\mu$m region near the gate-drain region. Based on human body model (HBM) measurements, the peak critical power that can typically be handled by grounded gate N-MOS devices is no more than 50–100 mW per micron of contact width. Thus for a 6–8 V holding voltage, the current must not exceed 5–15 mA/$\mu$m.

A typical N-MOS snapback device includes a gate defined by a poly layer, a drain in the form of an n+ region and silicide (cobalt or titanium silicide) and a source. A plot of the IV characteristics of such a snapback device is illustrated in FIG. 1 and indicated by reference 10. As is shown by the curve 10, current increases virtually unchecked after triggering, and only tapers off at extreme currents due to increased resistance caused by heating. In order to avoid burn-out, it is important not only to limit the current, but also to avoid excessive local current densities. One prior art solution is to use separation resistance in the form of an un-silicided portion (ballast) between the gate and the silicided drain. The IV characteristics of such an un-silicided portion are shown by curve 12 in FIG. 1, which shows a clear saturation current curve. The combined effect of including a ballast region for the snapback N-MOS device is shown by curve 14 which, in many instances, will provide a current limit as indicated. However, since ESD protection structures are usually not created as designed specific devices, they have to meet a span of specifications. Thus, a long, space consuming, ballasting region is typically implemented of up to 6–10 $\mu$m. A plan view of such a prior art device is illustrated in FIG. 2 in which the long n+ drain ballasting region is indicated by reference 20. This long n+ ballasting region, which excludes silicide, acts like a saturation resistor for the N-MOS snapback structure. It will be appreciated that the space consuming ballast region significantly increases the size of the device. Furthermore, simply including a current limiting resistor may cause electrical current stratification or filamentation phenomenon. Such excessive localized current densities are generally observed for structures with negative differential conductivity. Also, in some processes (for example National Semiconductor's PVIP 50 NSC) do not provide sufficient current dumping to below mA/$\mu$m, even at 6 $\mu$m ballasting length. A numerical simulation study of the PVIP 50 NSC structure shows that even at 6 $\mu$m ballasting region length, the snapback saturation current is approximately 20 mA/$\mu$m, which exceeds the estimated physical limitation levels of 100 mW/$\mu$m since the corresponding current level limitation is 10 mA/$\mu$m. Thus it creates irreversible failure during ESD operation. Hence a new design and more specifically a new compact design for the drain ballasting region is needed for C-MOS protection structures.

The present invention provides for a reduced snapback saturation current in a NMOS device by proposing a solution that takes into account the structure and process associated with a typical N-MOS device. FIG. 3 illustrates such a typical N-MOS device which includes a p-well or substrate 30, and oxide layer 32, and a polygate 34. The drain region 36 and source region 38 are formed in the substrate 30 by introducing n dopants to define the drain and source 36, 38 separated by a minimal gap 40. The minimal dimension gap 40 which separates the two n+ regions 36, 38 poses certain process difficulties due to the risk of dopant contamination. In order to avoid n dopant contamination in the space 40 when implanting the n+ regions of the drain and source, lightly doped regions 42, 44 are first diffused into the well or substrate 30, using the gate poly 34 as a mask. Thereafter, nitride spacers 46 are formed on either side of the gate poly 34 by depositing nitride over the entire structure and etching away the nitride to a certain depth. The high concentration n+ is then implanted. Typically, the high concentration n+ regions have doping levels that are approximately 100 times greater than the lightly doped regions. This process of first using lightly doped regions. This process of first using lightly doped regions is common in the art and, in the case of a drain, is typically referred to as a NLDD (lightly doped drain) region.

SUMMARY OF THE INVENTION

The present invention proposes using the NLDD region as a basis for achieving current limiting while avoiding excessive localized current densities.

Electrical currents stratification phenomenon, which is generally observed for any structure with negative differential conductivity, introduces problems. The present invention proposes defining distributed ballast drain regions to reduce current stratification through current spreading.

Also, since some processes such as PVIP 50 NSC do not achieve sufficient current dumping even at ballast lengths of 6 $\mu$m, the present invention proposes introducing a higher resistance level.

In accordance with the invention, there is provided a N-MOS snapback device with current limitation, which comprises a plurality of NLDD regions defined between a drain silicide and a gate of the device. The device typically includes a n+ drain ballasting region, wherein the NLDD regions may be formed in the n+ drain ballasting region of the device. Typically, the at least one NLDD region is larger than that of a conventional NMOS device, while the n+ composite region is smaller than that of a conventional NMOS device.

Further, according to the invention, there is provided a method of reducing snapback current in a snapback device by forming at least one distributed resistance means between gate and drain contacts of the device, for limiting saturation current, in addition to a n+ drain ballasting region. The distributed resistance means typically comprises at least one enlarged NLDD region which is ideally at least 1 $\mu$m in length.

Still further, according to the invention, there is provided a method of allowing the n+ drain ballasting region in a N-MOS snapback device to be reduced without substantially increasing current or localized current densities, by forming one or more NLDD regions in the current path between the drain silicide and the gate of the device. Preferably, the one or more NLDD regions are formed in the n+ drain ballasting region.

Still further according to the invention, there is provided a method of limiting snapback current in a N-MOS device, comprising forming at least one NLDD blocking regions between a drain silicide of the device and a gate of the device, wherein the majority of the length of the at least one NLDD region extends past the edge of the gate towards the drain contact. The device may further include a n+ drain ballasting region which may be formed between the drain silicide and the NLDD blocking region or may be distributed with the one or more NLDD blocking regions disbursed in the n+ drain ballasting region.

Still further, according to the invention, there is provided a NMOS snapback device, comprising at least one NLDD region defined between a drain contact and a gate of the device, wherein the majority of the length of the at least one NLDD region extends past the edge of the gate towards the drain contact. Typically the NLDD region is at least 1 µm in length.

DETAILED DESCRIPTION OF THE INVENTION

Figure 1:
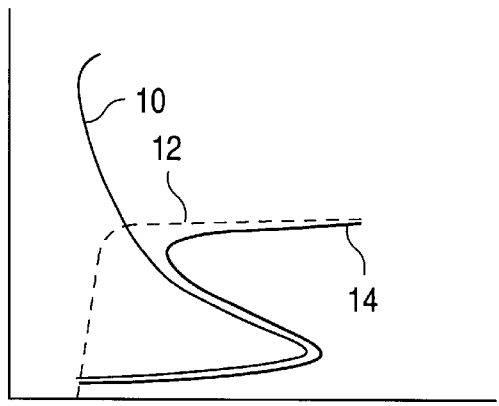
FIG. 1 is a set of prior art IV curves.
Figure 3:
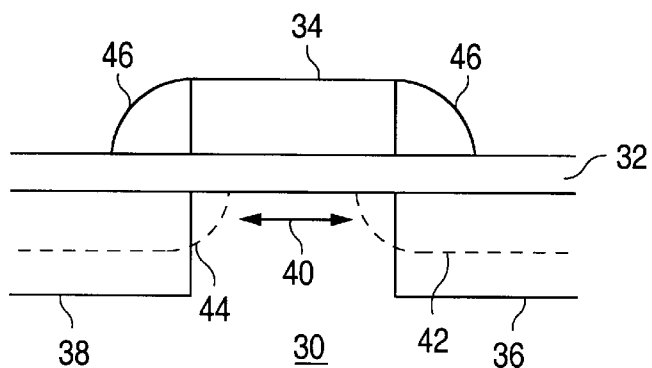
FIG. 3 is a sectional view through a prior art N-MOS device.
Figure 2:
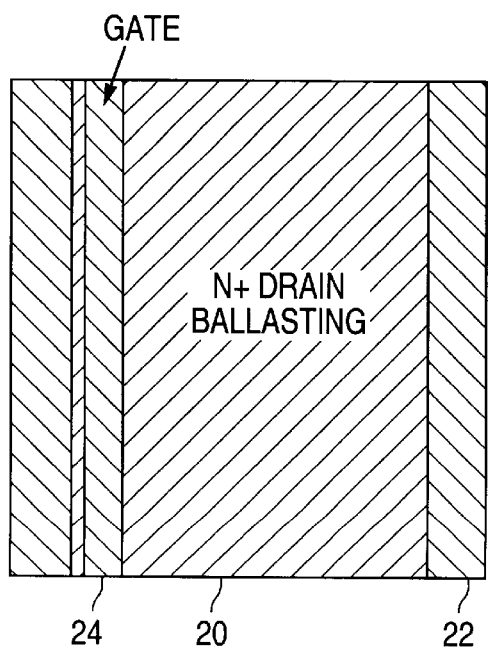
FIG. 2 is a plan view of a typical prior art N-MOS snapback device.

As shown in FIG. 2, the prior art solution to limiting snapback current is to incorporate a n+ drain ballast region 20 between the drain silicide 22 and the gate 24. Typical ballast region lengths are of the order of 6–10 µm. This solution therefore wastes a lot of space which could be used more effectively for supporting additional devices. Furthermore, even with such substantial ballast regions, the necessary current dumping is not always achieved. As mentioned above, numerical simulation studies for the PVIP 50 NSC show that even at 6 µm ballasting region length, the snapback saturation current of approximately 20 mA/µm which exceeds the estimated physical limitation levels of 100 mW/µm which correspond to current limits of 5–10 mA/µm.

Figure 4:
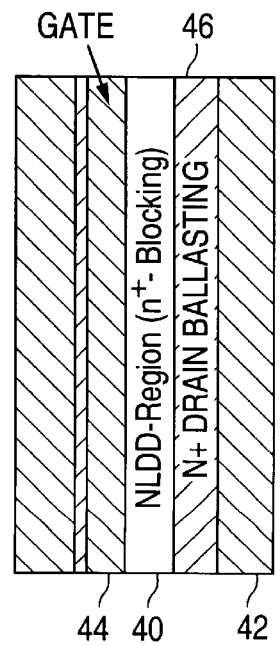
FIG. 4 is a plan view of one embodiment of the invention.

One embodiment of the proposed invention is illustrated in FIG. 4 in which a high resistance NLDD region 40 is formed, which is sized to partially block current flow from the drain silicide 42 to the gate 44. Current flows through the n+ drain ballast region 46 and is then constrained to flow through the NLDD region 40 which extends to the entire depth of the n+ drain ballast region 46. It will be appreciated that the NLDD region could extend only partially through the depth of the n+ drain ballasting region 46 thereby still allowing some of the current to flow through the ballasting n+ material. Such an embodiment has the benefit of distributing the ballast drain region thereby achieving current spreading and reducing current stratification.

Figure 5:
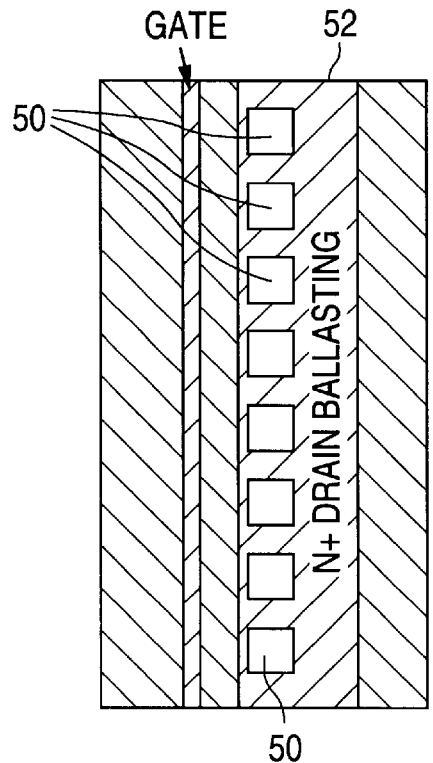
FIG. 5 is a plan view of another embodiment of the invention.

Another embodiment of the invention is illustrated in FIG. 5 in which distributed ballasting is achieved by forming a plurality of NLDD islands or regions 50 in the n+ drain ballast region 52. Again, the NLDD has a lower conductivity and therefore blocks some of the current. It also provides for enhanced current spreading thereby reducing current stratification.

Figure 6:
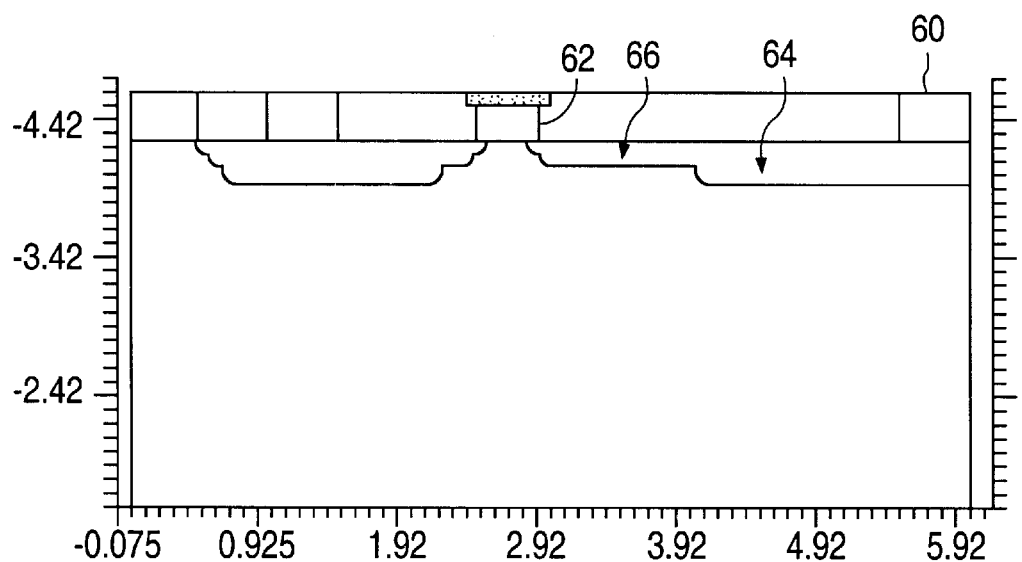
FIG. 6 is a sectional view through one embodiment of the invention.
Figure 7:
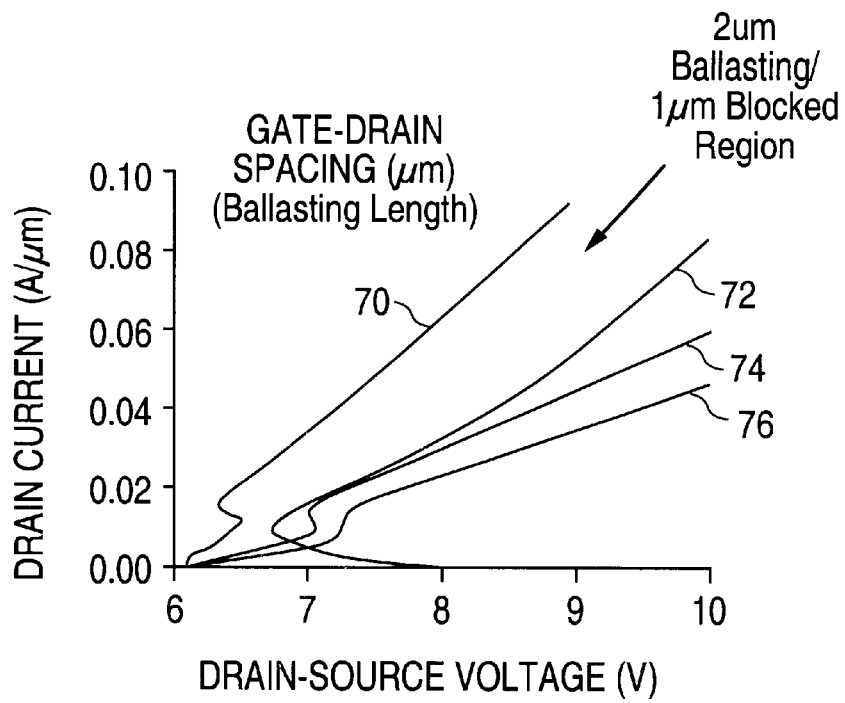
FIG. 7 are IV curves for different embodiments of the invention having different ballast region lengths.
Figure 8:
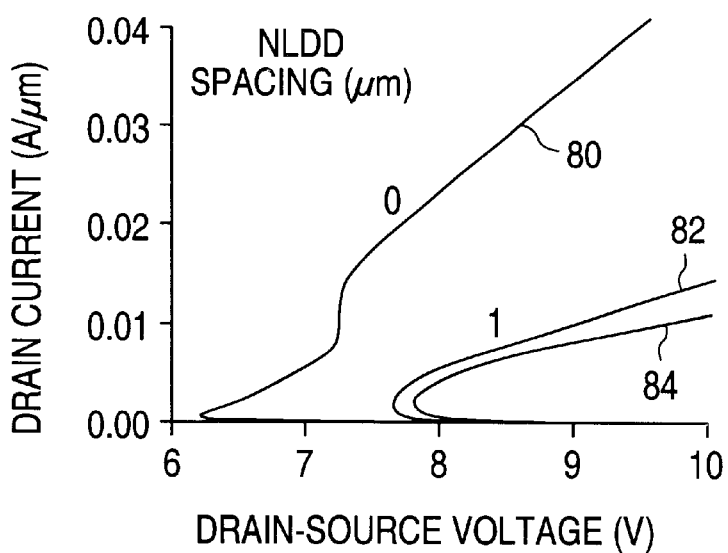
FIG. 8 are IV curves for different embodiments of the invention for different NLDD blocking region lenths.

The effects of introducing NLDD blocking regions is illustrated in FIGS. 7 and 8 for the embodiment illustrated in FIG. 6 which follows the principles described for the FIG. 4 embodiment. As shown in FIG. 6, the silicided drain 60 is separated from the gate 62 by a relatively short n+ ballast region 64 and NLDD region 66. Using this basic embodiment various lengths for the n+ ballast region 64 were considered while keeping the NLDD region length 66 constant at 1 µm. FIG. 7 shows the drain current variation with drain-source voltage for a total gate-drain spacing of 2.5 µm (curve 70). This consists of a 1 µm NLDD region 66 and a 1.5 µm n+ ballast region 64. Curve 72 is for a total gate-drain spacing of 3.5 µm. Curve 74 shows the effects on current for a gate-drain spacing of 4.5 µm. Curve 76 shows a curve for gate-drain spacing of 5.5 µm. As mentioned above, the length of the NLDD blocking region was kept constant at 1 µm to perform the simulated experiment illustrated in FIG. 7. Simulations were also performed for drain current against drain-source voltage for different lengths of the NLDD blocking region 66, while keeping the n+ balast region length constant at 5.5 µm. Curve 80 shows a prior art device without any additional NLDD region. Curve 82 shows a device with a NLDD region having a length of 1 µm, while curve 84 shows NLDD region length of 1.5 µm.

Figure 9:
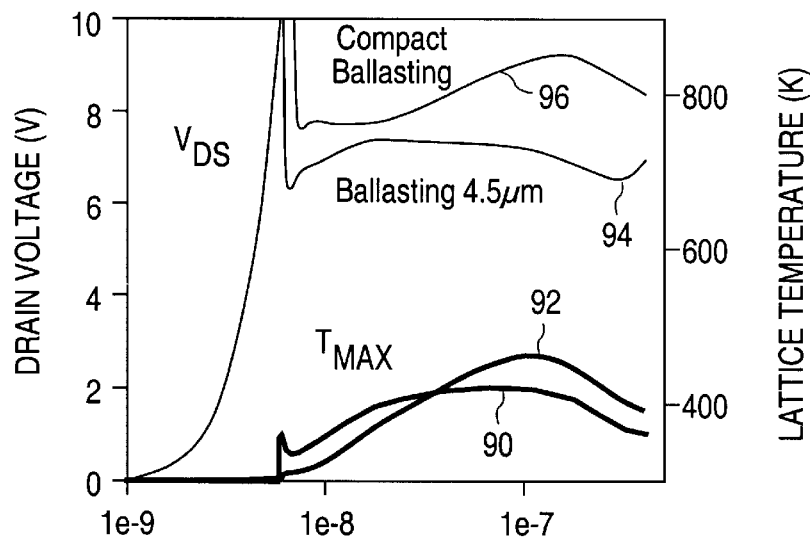
FIG. 9 shows drain voltage and lattice temperature curves changing with time for a conventional ballasted N-MOS snapback device and a device of the invention.
Figure 10:
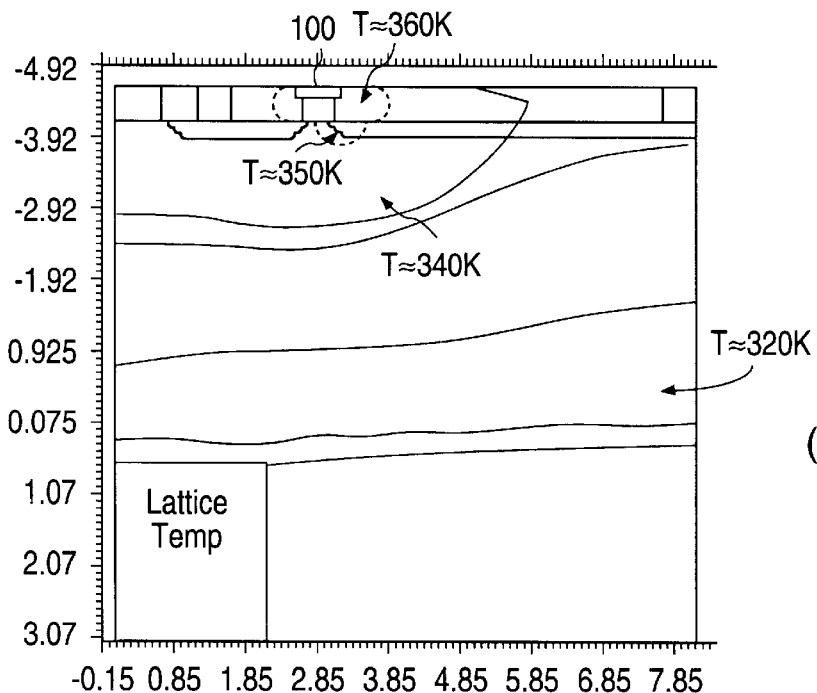
FIG. 10 shows the temperature distribution in a conventional ballasted device.
Figure 11:
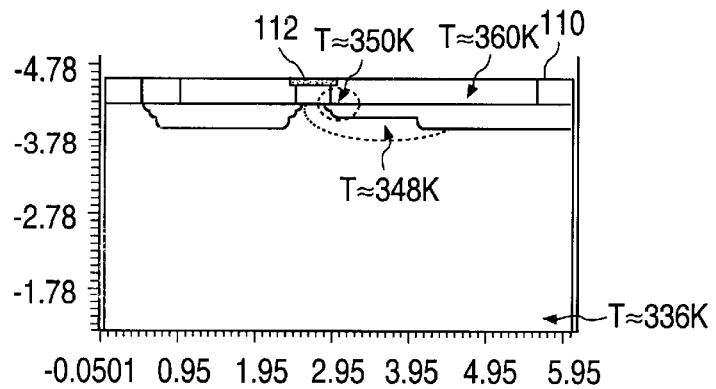
FIG. 11 shows the temperature distribution of one embodiment of the invention.

Notwhithstanding the much reduced size of the structure of the present invention, lattice temperatures are not significantly affected. FIG. 9 shows temperature curves with a lattice temperature changing with time for a prior art ballast device as shown by curve 90, using a ballast length of 4.5 µm. This is contrasted with a compact ballast region of one embodiment of the present invention, which produces a curve 92, and which shows only an insignificant increase in lattice temperature. The corresponding drain voltages are shown by the curves 94 for the prior art device, and 96 for the device of the present invention. In this particular embodiment the compact ballast length was reduced to 2.5 µm and incorporated a 0.5 µm NLDD region as a blocking region. The lattice temperature comparisons can also be viewed in FIGS. 10 and 11. FIG. 10 shows the conventional device using a 4.5 µm length ballast region. In contrast, a device of the present invention shows a temperature distribution that is not significantly different from the conventional structure with its 4.5 µm ballast region length. Moreover, FIG. 11 makes it clear that temperature distribution remains even, and shows no localized hot spots. It will thus be appreciated that significant advantages are achieved with the structures of the present invention by reducing snapback current and retaining an evenly distributed lattice temperature.

It will be appreciated that the embodiments discussed above are given by way of example only and that different configurations could be adopted without departing from the scope of the invention. In particular, different ratios of n+ ballast region length and NLDD region length could be used. Also the number of NLDD islands 50 could be adjusted, as could the ratio of the width of the islands relative to the intermediate n+ ballast portion. While the amount of doping of the NLDD and n+ ballast regions could be adjusted to affect the conductivity of these regions, preferred embodiments would preferably use standard process doping levels and instead merely adjust the sizes of these respective regions.

What is claimed is:

1. A method of reducing snapback saturation current in a NMOS snapback device, comprising forming at least one distributed high resistance means between gate and drain contacts of the device, in addition to a n+ drain ballasting region, wherein the distributed high resistance means leaves a direct current path through the n+ drain ballasting region.

2. A method of claim 1, wherein the distributed high resistance means comprises at least one lightly doped region.

3. A method of claim 2, wherein the at least one lightly doped region is at least 1 $\mu$m in length.

4. A method of allowing the n+ drain ballast region in a NMOS snapback device to be reduced without substantially increasing current or localized current densities, comprising providing at least one lightly doped region in the current path between the drain silicide and the gate of the device, without entirely interrupting the current path through the n+ drain ballast region.

5. A method of claim 4, wherein the at least one lightly doped region comprises a plurality of lightly doped islands defined in the n+ drain ballast region of the device.

6. A method of limiting snapback saturation current in a N-MOS device, comprising providing at least one lightly doped region between a drain contact of the device and a gate of the device, and providing n+ material between the drain contact and gate forming a direct current path between the drain contact and the gate, through or adjacent the at least one lightly doped region.

7. A method of claim 6, wherein the at least one lightly doped region is at least 1 $\mu$m in length.

8. A method of claim 6, wherein the n+ material comprises a n+ drain ballast region between the drain contact and the gate.

9. A method of claim 6, wherein the at least one lightly doped region takes the form of a plurality of lightly doped islands formed in the n+ material.

10. A method of limiting snapback saturation current in a N-MOS device, comprising forming a n+ drain ballast region with one or more lightly doped blocking regions defined in the n+ drain ballast region, wherein the one or more lightly doped blocking regions leave a direct current path through the n+ drain ballast region.

11. A NMOS snapback device, comprising at least one lightly doped region defined in a drain ballast region, wherein the lightly doped region has a lower doping level than the ballast region, and leaves a direct current path through the drain ballast region.

12. A device of claim 11, wherein the at least one lightly doped region is defined by the NLDD.

13. A device of claim 12, wherein the length of the drain ballast region is shorter than that of a conventional NMOS device.

14. A method of claim 1, wherein the distributed high resistance means comprises a plurality of lightly doped is/ands in the n+ drain ballasting region.

15. A method of claim 5, wherein the lightly doped islands comprise elongate regions extending between the drain silicide and the gate, and alternating with n+ drain ballast material.

16. A device of claim 11, wherein the at least one lightly doped region comprises a plurality of islands of lightly doped material defined in the drain ballast region.

17. A device of claim 16, wherein the islands extend between the drain and the gate of the NMOS device, at least partially to the depth of the drain ballast region.

* * * * *